US008644017B2

(12) United States Patent
Dunham et al.

(10) Patent No.: US 8,644,017 B2
(45) Date of Patent: Feb. 4, 2014

(54) STORAGE DEVICE CARRIERS FOR ADAPTING A STORAGE DEVICE OF A FIRST SIZE TO A SLOT FOR A STORAGE DEVICE OF A SECOND SIZE

(75) Inventors: John M. Dunham, Kechi, KS (US); Alan T. Pfeifer, Wichita, KS (US)

(73) Assignee: LSI Corporation, Milpitas, CA (US)

( * ) Notice: Subject to any disclaimer, the term of this patent is extended or adjusted under 35 U.S.C. 154(b) by 439 days.

(21) Appl. No.: 13/116,818

(22) Filed: May 26, 2011

(65) Prior Publication Data
US 2012/0299453 A1 Nov. 29, 2012

(51) Int. Cl.
*H05K 5/00* (2006.01)
(52) U.S. Cl.
USPC ............ 361/679.33; 361/679.35; 361/679.39; 361/679.41; 361/679.44; 361/679.58
(58) Field of Classification Search
USPC ............. 361/679.33–679.39, 679.41, 679.43, 361/679.44, 679.58, 725–728, 740, 361/752–759; 439/501; 220/4.02; 312/223.2, 319.1
See application file for complete search history.

(56) References Cited

U.S. PATENT DOCUMENTS

| 5,319,519 | A |   | 6/1994 | Sheppard et al. |
|---|---|---|---|---|
| 5,588,728 | A | * | 12/1996 | Eldridge et al. ............ 312/332.1 |
| 5,682,291 | A | * | 10/1997 | Jeffries et al. ............ 361/679.58 |
| 6,487,081 | B2 | * | 11/2002 | Homer et al. ................. 361/730 |
| 6,490,123 | B1 |   | 12/2002 | Okunaga et al. |
| 6,535,381 | B2 |   | 3/2003 | Jahne et al. |
| 6,999,306 | B2 |   | 2/2006 | Walczak et al. |
| 7,116,241 | B2 |   | 10/2006 | Post et al. |
| 7,145,770 | B1 |   | 12/2006 | Zimlin et al. |
| 7,327,580 | B2 |   | 2/2008 | Ruque |
| 7,349,204 | B2 |   | 3/2008 | Tanaka et al. |
| 7,453,707 | B2 |   | 11/2008 | Beall et al. |
| 7,460,365 | B2 |   | 12/2008 | Morris |
| 7,715,182 | B2 |   | 5/2010 | Signer et al. |
| 7,733,640 | B2 |   | 6/2010 | Huang |
| 7,864,539 | B2 |   | 1/2011 | Dunham et al. |
| 7,944,687 | B2 | * | 5/2011 | Walker et al. ............ 361/679.37 |
| 2002/0093759 | A1 |   | 7/2002 | Okunaga et al. |
| 2009/0091884 | A1 |   | 4/2009 | Walker et al. |
| 2010/0217909 | A1 |   | 8/2010 | Pavol et al. |

FOREIGN PATENT DOCUMENTS

| EP | 0589708 A2 | 3/1994 |
|---|---|---|
| JP | 3131595 U | 5/2007 |
| JP | 2008108405 A | 5/2008 |
| JP | 201105452 A | 3/2011 |

* cited by examiner

*Primary Examiner* — Jayprakash N Gandhi
*Assistant Examiner* — Hung Dang
(74) *Attorney, Agent, or Firm* — Duft Bornsen & Fettig

(57) ABSTRACT

Apparatus and devices for carrying a storage device and adapting it to a slot for a storage device having a different form factor. The system comprises an opening means for elastically deforming a shape of the system from an original shape so that the carrier may receive the storage device. The system also comprises restraining means for constraining the motion of the storage device within the system when the system returns to the original shape. Furthermore, the system comprises a spacing means for aligning the storage device with the slot while the storage device is restrained within the system.

8 Claims, 7 Drawing Sheets

STORAGE DEVICE CARRIERS FOR ADAPTING A STORAGE DEVICE OF A FIRST SIZE TO A SLOT FOR A STORAGE DEVICE OF A SECOND SIZE

BACKGROUND

1. Field of the Invention

The invention relates generally to storage systems and more specifically relates to carriers for adapting a storage device of a first size to a slot for a storage device of a second size.

2. Discussion of Related Art

Storage systems may be used to house a large number of storage devices (e.g., magnetic disks, optical drives, solid-state memory, etc.) and communicatively couple those storage devices with a computer system. Storage systems may comprise, for example, rack-mounted blades or other high density enclosures that each comprise multiple storage devices. Each blade may be stored within the rack, and may be communicatively coupled with the computer system by use of a suitable backplane or cabling structure (e.g., a cable chain). The blade itself may be opened to access the storage devices that it houses, and each storage device may be communicatively coupled with the blade via a hardware connection residing, for example, on a printed circuit board of the blade. To restrain the motion of each storage device within the blade, the blade will typically include slots that are sized for a specific type of drive. For example, it has been generally popular for blades to include slots for standard 3.5 inch form factor hard disks (i.e., the slots are sized to house devices with dimensions according to the 3.5 inch standard defined by the Electronic Industries Alliance (EIA)).

As technology has progressed, it has become desirable for storage systems to utilize smaller standard 2.5 inch form factor hard disks (i.e., the slots are sized to house devices with dimensions according to the 2.5 inch standard defined by the EIA). In addition to allowing a higher density of drives for a blade, 2.5 inch form factor storage devices typically exhibit more desirable characteristics such as faster spindle speeds (and therefore faster rates for accessing and retrieving data stored on the device). Unfortunately, these devices may not be used in conjunction with existing high density enclosures that have been dimensioned for 3.5 inch form factor drives unless they are adapted in some manner to fit into existing slots. Numerous carriers and adapters are known, but it remains cumbersome to screw 2.5 inch form factor drives into 3.5 inch form factor carriers.

As a further consideration, in storage environments, a field engineer may manage hundreds, if not thousands of storage devices on a daily basis. This may involve swapping storage devices between enclosures, removing storage devices, adding storage devices, cleaning or dusting enclosures, and other routine tasks. To this end, a field engineer desires hardware that simplifies the use of the carriers described above during routine maintenance on the storage system.

Thus it is an ongoing challenge to adapt standard 2.5 inch form factor drives to enclosures having slots dimensioned for a standard 3.5 inch form factor in a manner that is cost-efficient, simple, and easy to use.

SUMMARY

The present invention solves the above and other problems, thereby advancing the state of the useful arts, by providing carriers/adapters for adapting a storage device of a first form factor to a slot for a second form factor, wherein the carrier is capable of experiencing elastic deformation in order to receive the storage device, and the carrier further experiences sufficient spring force while deformed that it may return to its original shape to house the storage device. Thus, the motion of the storage device may be restrained when the carrier returns to its original shape. These systems provide further advantages in that they are substantially tool-less (i.e., they do not require screwdrivers or other hand tools to mount the drive within the carrier) and thus are easier to use than tool-based methods of mounting (i.e., the storage device may be "snapped in," as opposed to being screwed into a mounting device with four separate screws).

In one aspect hereof, a carrier for a storage device is provided. The carrier is adapted to fit the storage device into a slot adapted for a different size of storage device. The carrier comprises an opening means for elastically deforming a shape of the carrier from an original shape so that the carrier may receive the storage device. The carrier also comprises at least two restraining means for constraining the motion of the storage device within the carrier when the carrier returns to the original shape. Furthermore, the carrier comprises a spacing means for aligning the storage device with the slot while the storage device is restrained within the carrier.

Another aspect hereof provides another carrier for a storage device. The carrier is adapted to fit the storage device into a slot adapted to receive a different size of storage device. The carrier comprises a first and second side wall, a first and second protrusion, and a lateral member. The first side wall comprises a first inward surface of the carrier that defines a first plane. The first protrusion is for constraining the motion of the storage device at the carrier, is fixedly attached to the first side wall, and projects outward from the first plane towards an inner portion of the carrier. The first protrusion is adapted to contact and restrain the motion of the storage device. The second side wall comprises a second inward surface of the carrier that defines a second plane substantially parallel with the first plane. The second protrusion is for constraining the motion of the storage device at the carrier, is fixedly attached to the second side wall, and projects outward from the second plane towards an inner portion of the carrier. The second protrusion is adapted to contact and restrain the motion of the storage device. The lateral member comprises a third inward surface of the carrier that defines a third plane substantially orthogonal to the first plane and the second plane, and is fixedly attached to each side wall. The lateral member is adapted to experience elastic deformation that increases a distance between the first protrusion and the second protrusion sufficiently to allow for insertion of the storage device into the carrier, wherein when the lateral member is elastically deformed, it experiences spring force sufficient to return the carrier to an original shape that restrains the storage device within the carrier.

DETAILED DESCRIPTION OF THE DRAWINGS

The following embodiments address existing issues with adapting a storage device of a first form factor to fit or mount a slot for a second form factor, by providing carriers/adapters that are capable of experiencing elastic deformation in order to receive a storage device, wherein the carriers further experience sufficient spring force while deformed that they may return to their original shape to house the storage device. These carriers are substantially tool-less, and are also significantly easier to use than tool-based methods of adapting a storage device to slot for a storage device having a different form factor.

Figure 1:
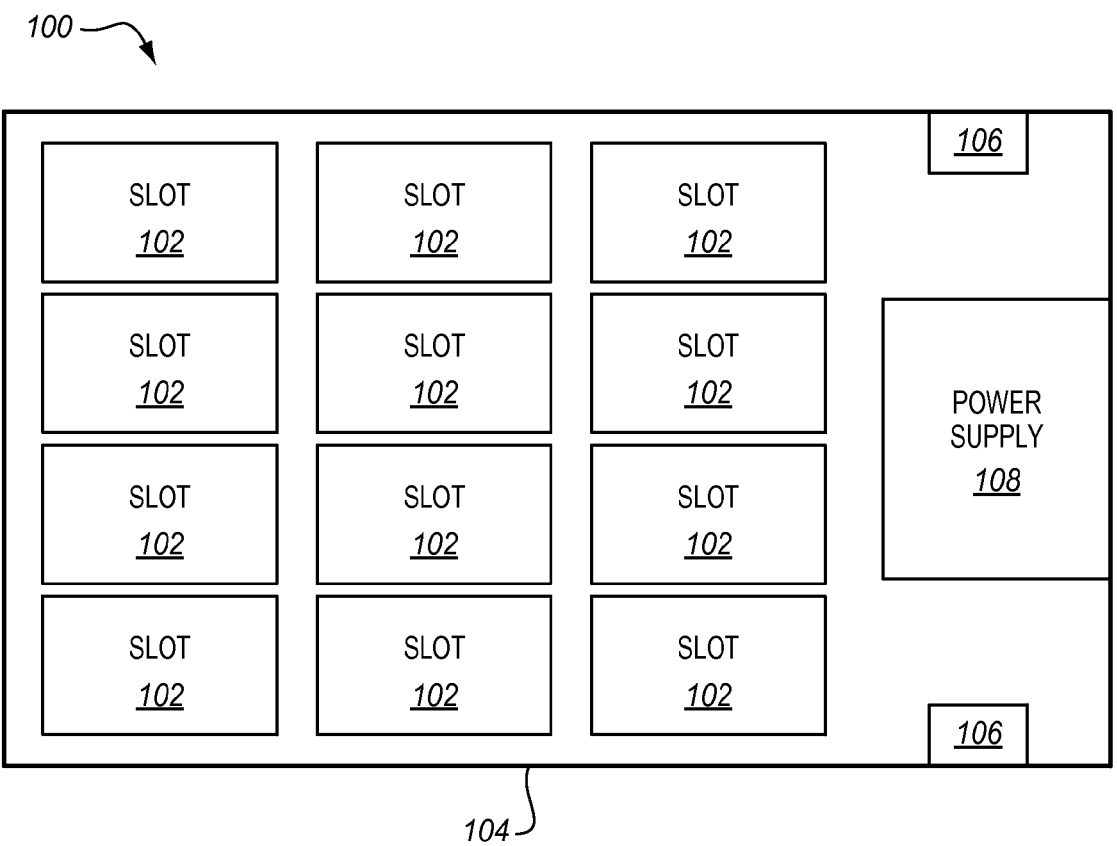
FIG. 1 is a block diagram of an exemplary high density enclosure in accordance with features and aspects hereof.

FIG. 1 is a block diagram of an exemplary high density enclosure 100 in accordance with features and aspects hereof. In this embodiment, high density enclosure 100 comprises multiple slots 102, each slot adapted to receive a storage device dimensioned according to a defined form factor (e.g., a 3.5 inch form factor). High density enclosure 100 may also be referred to as a "blade drive" or "blade enclosure." High density enclosure further comprises a housing structure 104, and optionally includes motors 106 for extending high density enclosure 100 out of a rack. High density enclosure 100 may further optionally include a power supply 108 for powering storage devices located at slots 102. High density enclosure 100 communicatively couples storage devices of slots 102 so that they may be accessed by a computer system.

One of ordinary skill in the art will appreciate that high density enclosure 100 may be dimensioned to enclose a larger or smaller number of storage devices, but will typically be dimensioned to have a size that allows for insertion and removal into a standardized rack-based mounting system. Furthermore, it will be appreciated that countless different embodiments of similar or dissimilar drive enclosures/blades may be provided, and high density enclosure 100 is but one exemplary embodiment of such an enclosure. For example, the rack and enclosure may be defined by EIA standard 310-D.

Figure 2:
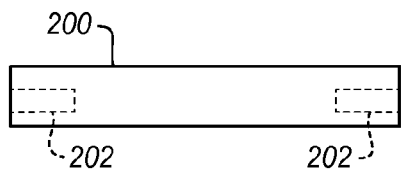
FIGS. 2-5 are block diagrams of an exemplary storage device in accordance with features and aspects hereof.
Figure 3:
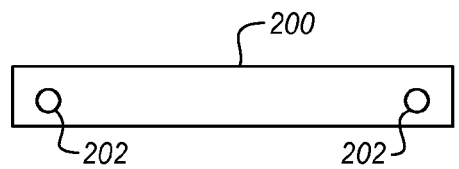
Figure 4:
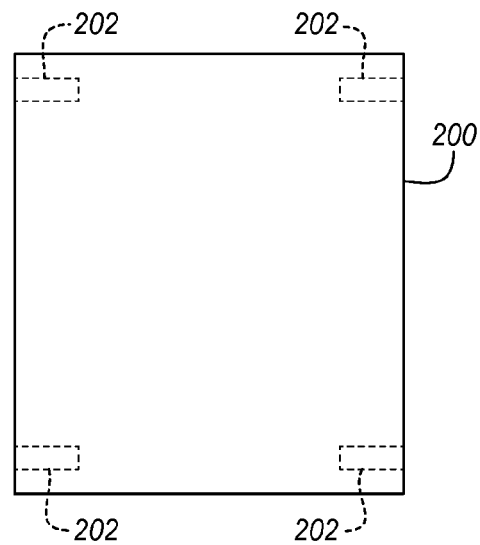
Figure 5:
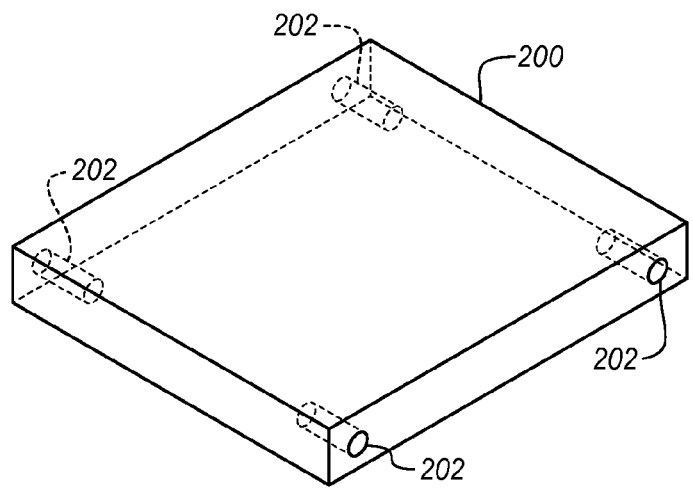

FIGS. 2-5 are block diagrams of an exemplary storage device 200 in accordance with features and aspects hereof. FIG. 2 illustrates a front view, FIG. 3 illustrates a side view, FIG. 4 illustrates a top view, and FIG. 5 illustrates a perspective view of storage device 200. Storage device 200 has a form factor (e.g., a standard 2.5 inch form factor) that is different than the form factor of the slots for high density enclosure 100 (e.g., a standard 3.5 inch form factor). Storage device 200 may comprise any well-known device for storing data in accordance with a known storage technology (e.g., solid state drives, optical drives, magnetic disks, etc.). In this embodiment, storage device 200 comprises multiple receptacles 202. Receptacles 202 may be used for attachment of storage device 200 to a mounting bracket or similar device. Standards defining the dimensions of the form factor of storage device 200 may also define the number, location, and dimensions of receptacles 202. For example, receptacles 202 typically comprise four substantially coplanar receptacles, wherein two receptacles are placed at either side of storage device 200. Furthermore, receptacles 202 will typically comprise threaded holes intended to receive a screw, bolt, or similar device which may thereby affix storage device 200 to a mounting bracket.

Figure 6:
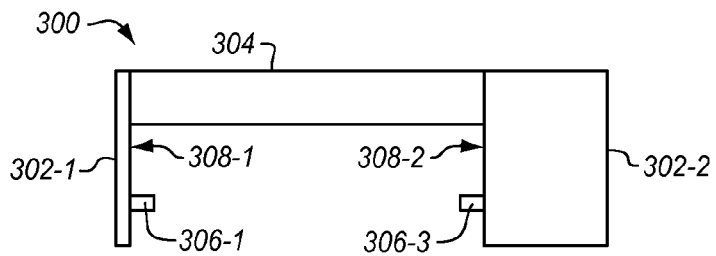
FIGS. 6-9 are block diagrams of an exemplary storage device carrier for adapting a storage device to a new form factor in accordance with features and aspects hereof.
Figure 7:
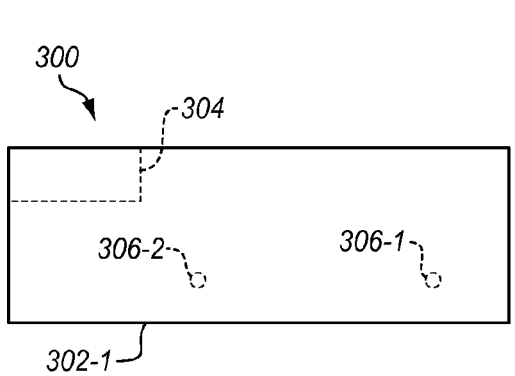
Figure 8:
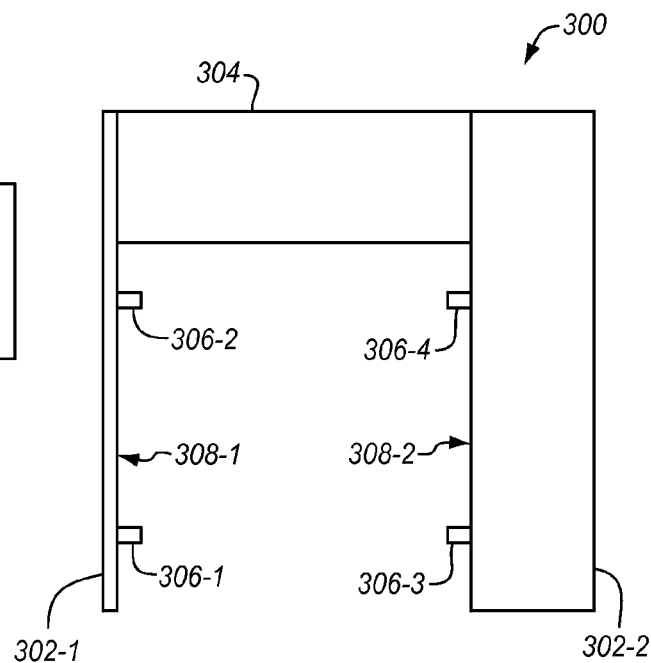
Figure 9:
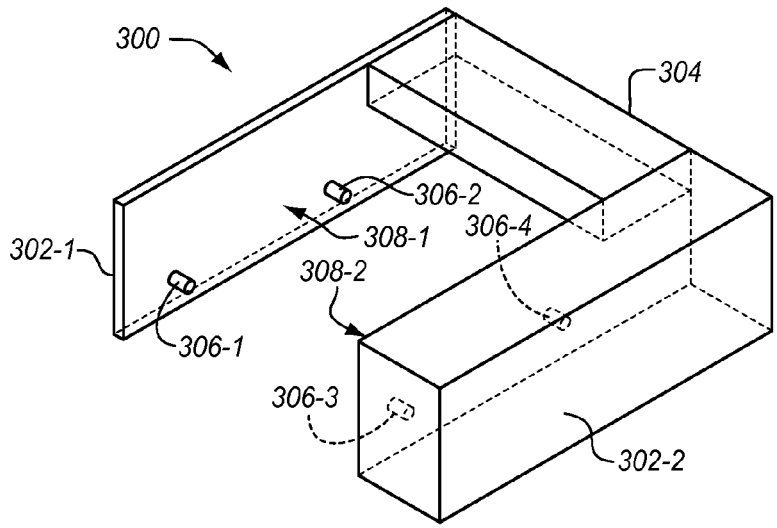

FIGS. 6-9 are block diagrams of an exemplary storage device carrier 300 for adapting a storage device 200 to a new form factor in accordance with features and aspects hereof. FIG. 6 illustrates a front view, FIG. 7 illustrates a side view, FIG. 8 illustrates a top view, and FIG. 9 illustrates a perspective view of carrier 300. In this embodiment, carrier 300 comprises two side walls 302-1 and 302-2, although carrier 300 could comprise a greater number of side walls if desired. Each side wall 302 includes an inward surface 308, wherein an inward surface is a portion of a side wall 302 that faces an inner portion of carrier 300. For example, inward surface 308-1 of sidewall 302-1 faces an inward portion of carrier 300, as does inward surface 308-2 of sidewall 302-2. The inward surfaces 308 of side walls 302 define substantially parallel planes.

Side walls 302 are fixedly attached to a lateral member 304. The inward surface of lateral member 304 is substantially orthogonal to the inward surfaces of side walls 302, and lateral member 304 will typically connect side walls 302 to each other. Lateral member 304 may reside, for example, at the top of carrier 300, at the back of carrier 300, or at the front of carrier 300. Side walls 302 and lateral member 304 are dimensioned to define a housing structure that fits snugly about the form factor of a storage device (e.g., storage device 200 of FIGS. 2-5). Furthermore, carrier 300 itself has an exterior dimensioned to snugly fit within the form factor for a slot of a high density enclosure (e.g., slot 102 of enclosure 100 of FIG. 1). Thus, carrier 300 adapts a drive of a smaller form factor to fit a slot for a larger form factor.

To ensure that the motion of a storage device is adequately restrained while the storage device is within carrier 300, each side wall 302 includes at least one protrusion 306 for fitting into receptacles of the storage device (e.g., receptacles 202 of storage device 200 of FIGS. 2-5). In one embodiment, side wall 302-1 comprises protrusions 306-1 and 306-2, while side wall 302-2 comprises protrusions 306-3 and 306-4. One of ordinary skill in the art will appreciate that protrusions 306, when inserted into receptacles, may fully restrain the rotation and/or motion of a storage device within carrier 300. Furthermore, protrusions 306 will typically be aligned with receptacles when they are positioned according to defined standards for the form factor of the storage device.

In order to properly adapt a storage device to a slot of a high density enclosure, the widths, heights, and depths of side walls 302 at carrier 300 may vary significantly. In order to reduce usage of material, side walls 302 need not be solid structures, but may be partly or completely hollow. In addition to side walls 302, carrier 300 may further comprise spacing elements sufficient to match carrier 300 to the dimensions of slots of an enclosure (e.g., spacing elements may comprise deformable pads, rigid structural features of side walls 302, etc.). Furthermore, spacing elements may be designed to position the storage device within a slot for communicative coupling with the enclosure. For example, spacing elements may align a SCSI adapter of the storage device with a SCSI adapter of the enclosure. A spacing element may be fixedly or removably attached to carrier 300.

Carrier 300 may be a single molded piece, or may comprise multiple separate elements affixed to each other. Preferably, carrier 300 will comprise a suitable material (e.g., steel, a steel alloy, or other materials capable of experiencing elastic deformation).

Figure 10:
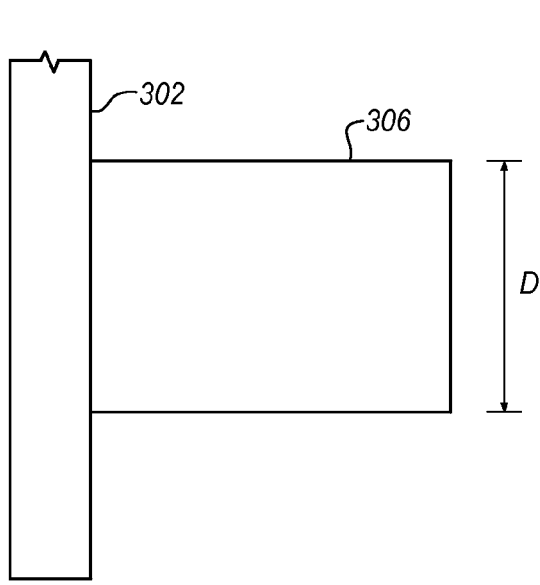
FIGS. 10-11 are block diagrams of an exemplary protrusion of a carrier in accordance with features and aspects hereof.
Figure 11:
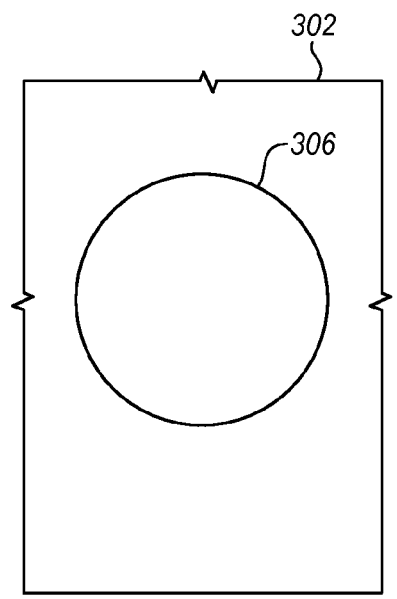

FIGS. 10-11 are block diagrams of an exemplary protrusion 306 of a carrier 300 in accordance with features and aspects hereof. FIG. 10 illustrates a front view and FIG. 11 illustrates a side view. In this embodiment, each protrusion 306 comprises a cylindrical projection from a side wall 302, wherein the cylinder has a diameter D. Each cylindrical projection may be adapted for alignment with receptacles of a storage device (e.g., receptacles 202 of storage device 200 of FIGS. 2-5) in accordance with form factor standards, such that when the storage device is inserted into a carrier, each protrusion 306 aligns with a receptacle. Each protrusion 306 will typically project substantially orthogonally from a side wall 302. Additionally, protrusions 306 will typically be substantially coplanar with each other, and protrusions 306 from different side walls 302 will typically project in substantially opposite directions (i.e., they will project from opposite side walls towards each other).

Figure 12:
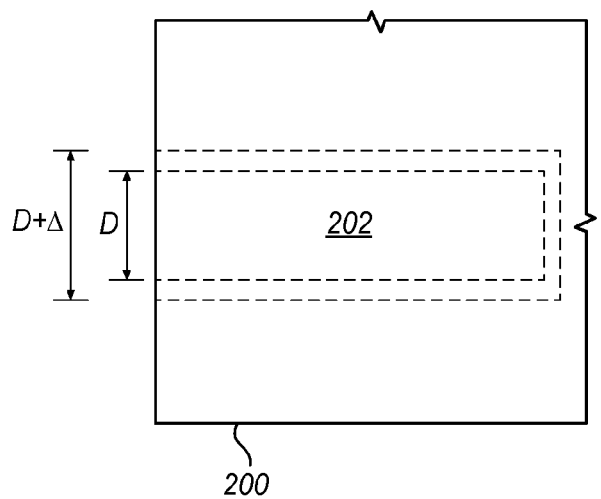
FIGS. 12-13 are block diagrams of an exemplary receptacle of a storage device in accordance with features and aspects hereof.
Figure 13:
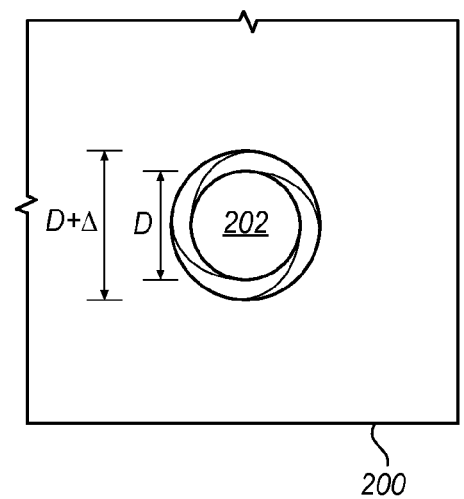

FIGS. 12-13 are block diagrams of an exemplary receptacle 202 of a storage device 200 in accordance with features and aspects hereof. FIG. 12 is a front view, and FIG. 13 is a side view. Receptacle 202 may comprise any shape, although receptacles 202 will typically comprise threaded holes for receiving a screw, bolt, or similar mechanical device. When receptacle 202 comprises a threaded hole, it will be appreciated that receptacle 202 has an inner diameter D, corresponding to the inner diameter of the thread. Receptacle 202 also has an outer diameter D+Δ, corresponding to an outer diameter of the thread. In this figure, Δ corresponds to an arbitrary thread depth for receptacle 202. It will be appreciated that the size and location of receptacles 202 is generally standardized among storage devices having the same form factor. Thus, protrusions of a carrier may each be aligned and dimensioned to have diameter D corresponding to the inner thread diameter of a receptacle 202 of storage device 200, even before knowing the exact make, model, or product number of storage device 200.

Figure 14:
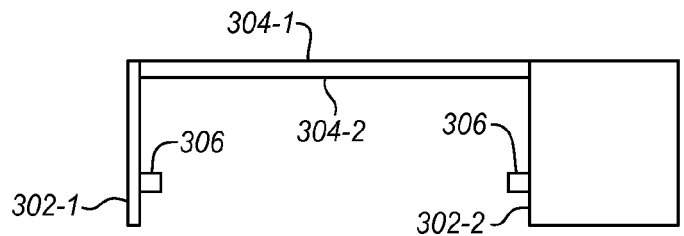
FIGS. 14-17 are block diagrams of an exemplary carrier undergoing elastic deformation to receive a storage device in accordance with features and aspects hereof.
Figure 15:
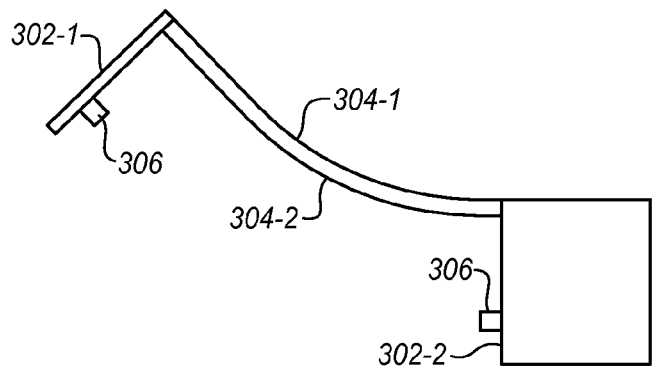
Figure 16:
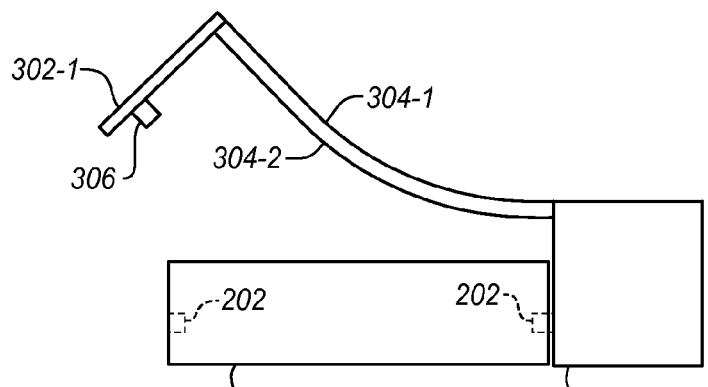
Figure 17:
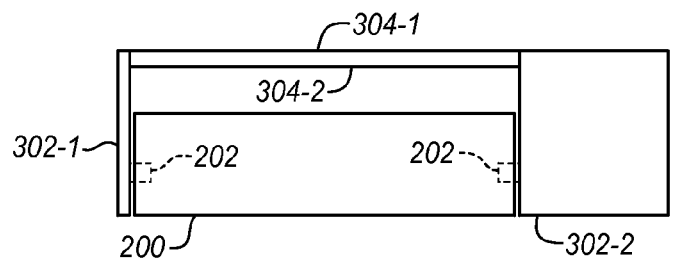

FIGS. 14-17 are block diagrams of an exemplary carrier 300 undergoing elastic deformation to receive a storage device 200 in accordance with features and aspects hereof. In FIG. 14, carrier 300 is at rest in a default shape. However, in FIG. 15, lateral member 304 of carrier 300 experiences elastic beam deflection sufficient to allow receptacles 202 of storage device 200 to be inserted or otherwise "slipped" onto protrusions 306 of side wall 302-2. It will be appreciated that lateral member 304 includes an outward surface 304-1, and an inward surface 304-2. During elastic beam deflection of lateral member 304, outward surface 304-1 experiences compression, while inward surface 304-2 experiences extension. While experiencing elastic deflection, lateral member 304 generates a spring force sufficient to return it to its original shape at carrier 300. With carrier 300 now in a new shape, storage device 200 may be inserted onto protrusions 306 of side wall 302-2, as depicted in FIG. 16. Once storage device 200 has been inserted onto protrusions 306 of side wall 302-2, lateral member 304 may be released, thereby returning to its original shape and inserting protrusions 306 of side wall 302-1 into receptacles 202 of storage device 200. Thus, carrier 300 holds storage device 200 when carrier 300 returns to its original shape, as depicted in FIG. 17. Utilizing such an insertion mechanism, a field engineer may quickly adapt a storage device having one form factor to an enclosure having slots of another form factor. Additionally, a field engineer has no need for specialized tools or indeed any tools at all in order to achieve this goal, because the task may be performed by hand.

Figure 18:
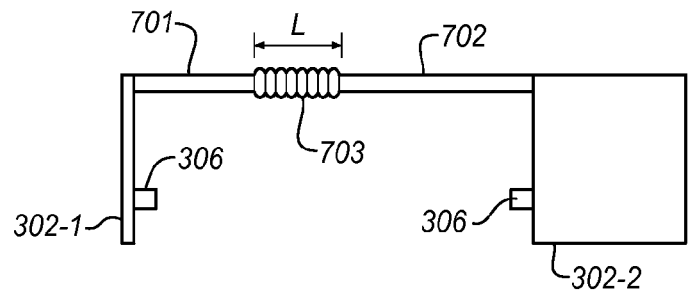
FIGS. 18-21 are further block diagrams of an exemplary carrier undergoing elastic deformation to receive a storage device in accordance with features and aspects hereof.
Figure 19:
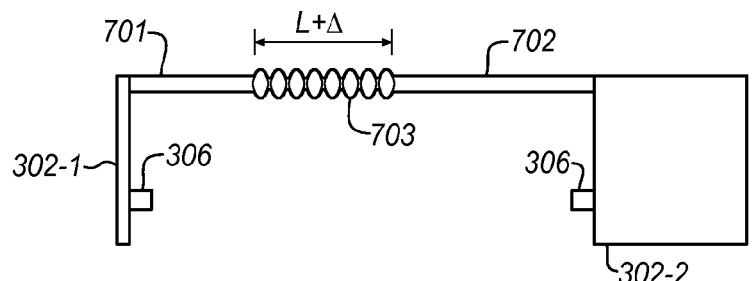
Figure 20:
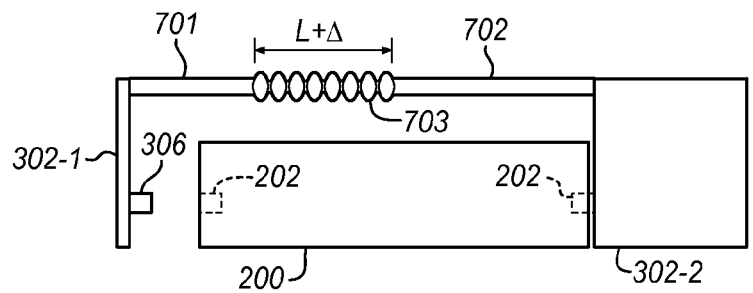
Figure 21:
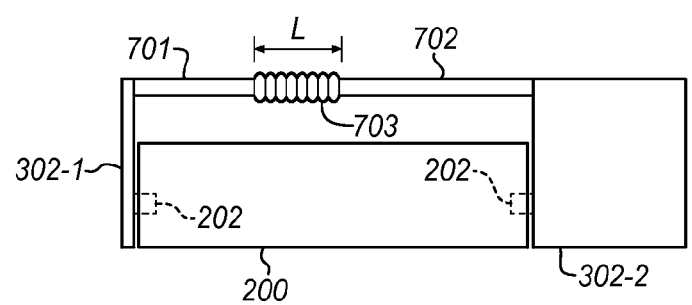

FIGS. 18-21 are further block diagrams of an exemplary carrier 300 undergoing elastic deformation to receive a storage device 200 in accordance with features and aspects hereof. In this embodiment, lateral member 304 comprises two rigid members 701 and 702, and an elastic element 703. Rigid members 701 and 702 may be designed to substantially restrain the directions in which elastic element 703 may be deformed by a user. Further, rigid members 701 and 702 may be attached to each other via elastic element 703. Elastic element 703 may comprise, for example, a coiled spring, a curvilinear spring, an elastomer, or other known materials and designs capable of generating a restorative spring force. As depicted in FIG. 18, elastic element 703 experiences minimal or no deflection in a resting state and has a length of L, but when side walls 302 are pulled apart from each other as in FIG. 19, elastic element 703 experiences elastic deformation sufficient to increase the length of elastic element 703 to L+Δ. In this figure, Δ corresponds to an arbitrary distance. While the length of elastic element 703 remains L+Δ, protrusions 306 of side wall 302-2 may be inserted into receptacles 202 of storage device 200, as depicted in FIG. 20. Then, by releasing one of side walls 302, elastic element 703 experiences spring force sufficient to return it to a length less than L+Δ, thereby inserting protrusions 306 of side wall 302-1 into receptacles 202 of storage device 200 and fully restraining the motion and/or rotation of storage device 200, as depicted in FIG. 21. In one embodiment, elastic element 703 returns to length L while carrier 300 holds storage device 200. In other embodiments, elastic element 703 returns to a length greater than L, but less than L+Δ. In such embodiments, elastic element 703 continues to apply spring force that pulls protrusions 306 of carrier 300 into receptacles 202 of storage device 200.

Figure 22:
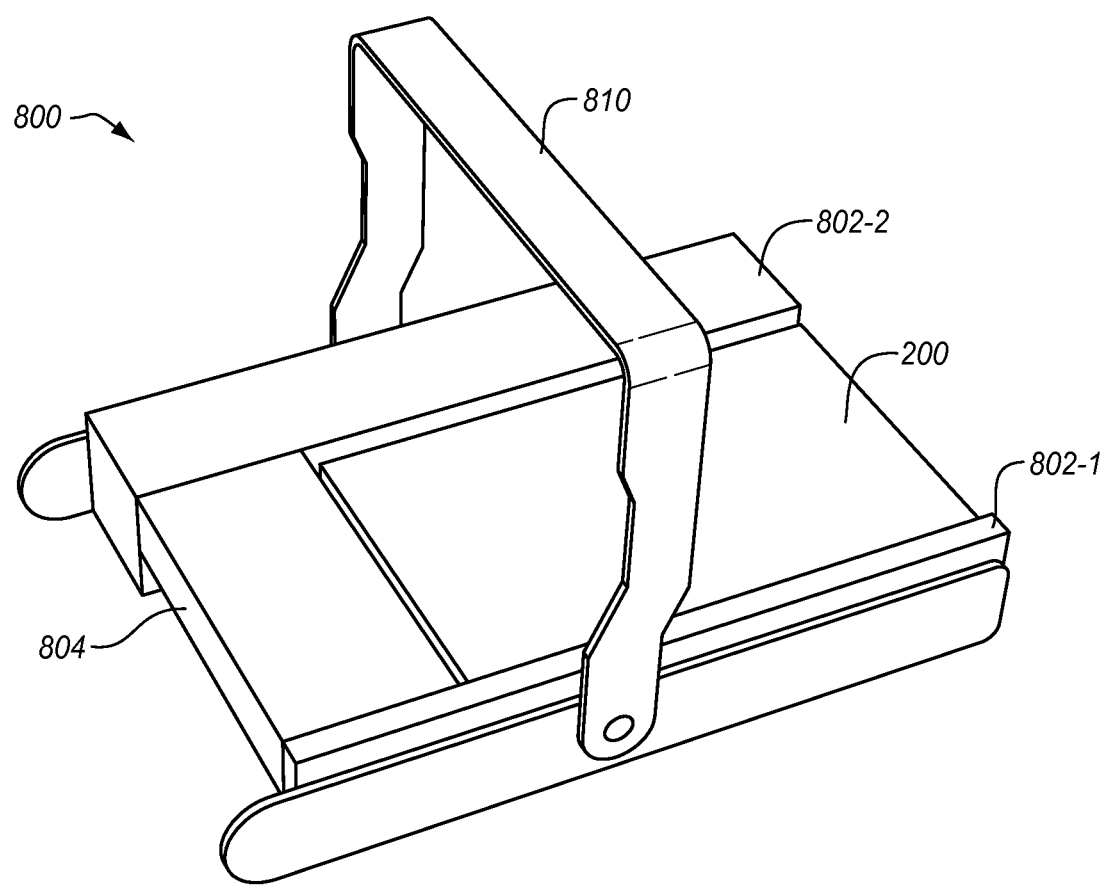
FIG. 22 illustrates a further embodiment wherein a carrier may comprise a Customer Replaceable Unit (CRU) having a form factor matched to slots of a high density enclosure in accordance with features and aspects hereof.

FIG. 22 illustrates a further embodiment wherein a carrier 300 comprises a Customer Replaceable Unit (CRU) 800 having a form factor matched to slots of an enclosure (e.g., slots 102 of enclosure 100 of FIG. 1) in accordance with features and aspects hereof CRU 800 may comprise an external housing and a handle 810 for holding CRU 800 and inserting CRU 800 into a slot of an enclosure. For example, the CRU may include an external housing having sidewalls 802-1 and 802-2, and also lateral member 804. It will be appreciated that, depending upon how CRU 800 aligns storage device 200, storage device 200 may imbalance CRU 800, making the body of CRU 800 rotate, and thereby pinching handle 810 of CRU 800 against fingers that may grip handle 810. This is generally undesirable. To address this issue, numerous solutions may be used. For example, handle 810 may include a mechanical stop (e.g., an embossment or catch) to prevent full rotation of the body of CRU 800. In another example, the weight of CRU 800 or the position of the rotational axis of handle 810 may be altered in order to balance the body of CRU 800. In a still further embodiment, the body of CRU 800 may include a "finger hole" or slot for an operator to push the CRU body into a balanced position while CRU 800 is being carried at the handle.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A carrier for a storage device, the carrier adapted to fit the storage device into a slot adapted to receive a different size of storage device, the carrier comprising:
   a first side wall comprising a first inward surface of the carrier that defines a first plane;
   a first protrusion for constraining the motion of the storage device at the carrier, the first protrusion fixedly attached to the first side wall and projecting outward from the first plane towards an inner portion of the carrier, the first protrusion adapted to contact and restrain the motion of the storage device;
   a second side wall comprising a second inward surface of the carrier that defines a second plane substantially parallel with the first plane;
   a second protrusion for constraining the motion of the storage device at the carrier, the second protrusion fixedly attached to the second side wall and projecting outward from the second plane towards an inner portion of the carrier, the second protrusion adapted to contact and restrain the motion of the storage device; and
   a lateral member comprising a third inward surface of the carrier that defines a third plane substantially orthogonal to the first plane and the second plane, the lateral member fixedly attached to each side wall, the lateral member adapted to experience elastic deformation that increases a distance between the first protrusion and the second protrusion sufficiently to allow for insertion of the storage device into the carrier, wherein when the lateral member is elastically deformed, it experiences spring force sufficient to return the carrier to an original shape that restrains the storage device within the carrier.

2. The carrier of claim 1,
   wherein the first protrusion is further adapted to be aligned with a first receptacle of the storage device and inserted into the first receptacle, and
   wherein the second protrusion is further adapted to be aligned with a second receptacle of the storage device and inserted into the second receptacle.

3. The carrier of claim 2,
   wherein each protrusion comprises a cylinder having a diameter not greater than an inner diameter of each receptacle, and wherein a cylinder length of each protrusion is not greater than a depth of each receptacle.

4. The carrier of claim 1,
   wherein the elastic deformation of the lateral member comprises deflection.

5. The carrier of claim 1,
   wherein the elastic deformation of the lateral member comprises extension.

6. The carrier of claim 1,
   wherein the carrier comprises a Customer Replaceable Unit (CRU), the CRU comprising:
      a handle for carrying the CRU and inserting the CRU into the slot, wherein the handle is connected for rotational movement with respect to each side wall.

7. The carrier of claim 6,
   wherein the first side wall, the second side wall, and the lateral member are adapted to align the storage device with the slot when the storage device is restrained within the carrier.

8. The carrier of claim 1,
   wherein the storage device is a 2.5 inch form factor storage device, and the slot is adapted to receive a 3.5 inch form factor storage device.

* * * * *